United States Patent
Bell et al.

(10) Patent No.: US 6,309,926 B1
(45) Date of Patent: *Oct. 30, 2001

(54) THIN RESIST WITH NITRIDE HARD MASK FOR GATE ETCH APPLICATION

(75) Inventors: Scott A. Bell, San Jose; Christopher F. Lyons, Fremont; Harry J. Levinson, Saratoga; Khanh B. Nguyen, San Mateo; Fei Wang; Chih Yuh Yang, both of San Jose, all of CA (US)

(73) Assignee: Advanced Micro Devices, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/205,211

(22) Filed: Dec. 4, 1998

(51) Int. Cl.$^7$ ................................................ H01L 21/8242
(52) U.S. Cl. ............................................ 438/257; 438/264
(58) Field of Search ......................................... 438/257, 264

(56) References Cited

U.S. PATENT DOCUMENTS

| | | |
|---|---|---|
| 4,299,911 | 11/1981 | Oochi et al. . |
| 4,306,006 | 12/1981 | Descamps et al. . |
| 4,804,637 * | 2/1989 | Smayling et al. ............... 437/52 |
| 5,040,020 | 8/1991 | Rauschenbach et al. . |
| 5,079,600 | 1/1992 | Schnur et al. . |
| 5,332,648 | 7/1994 | Kihara et al. . |
| 5,464,538 | 11/1995 | Schmidt et al. . |
| 5,510,230 | 4/1996 | Tennant et al. . |
| 5,521,031 | 5/1996 | Tennant et a. . |
| 5,534,312 | 7/1996 | Hill et al. . |
| 5,591,301 | 1/1997 | Grewal . |
| 5,679,608 | 10/1997 | Cheung et al. . |
| 5,786,262 | 7/1998 | Jang et al. . |
| 5,817,567 | 10/1998 | Jang et al. . |
| 5,897,366 * | 4/1999 | Shiralagi et al. ................ 438/604 |
| 5,928,964 * | 7/1999 | Brankner ........................ 438/714 |
| 5,930,634 * | 7/1999 | Hause et al. .................... 438/307 |
| 5,998,264 * | 12/1999 | Wu ................................ 438/260 |
| 6,027,861 * | 2/2000 | Yu et al. ........................ 430/316 |
| 6,117,791 * | 9/2000 | Ko et al. ....................... 438/723 |
| 6,159,829 * | 12/2000 | Warren et al. ................. 438/530 |
| 6,225,168 * | 5/2001 | Gardner et al. ................ 438/287 |

* cited by examiner

Primary Examiner—John F. Niebling
Assistant Examiner—Jennifer M. Kennedy
(74) Attorney, Agent, or Firm—Amin & Turocy, LLP

(57) ABSTRACT

A method of forming a gate structure is provided. In the method, a nitride layer is formed on a gate material layer. An ultra-thin photoresist layer is formed on the nitride layer. The ultra-thin photoresist layer is patterned with short wavelength radiation to define a pattern for the gate. The ultra-thin photoresist layer is used as a mask during a first etch step to transfer the gate pattern to the nitride layer. The first etch step includes an etch chemistry that is selective to the nitride layer over the ultra-thin photoresist layer. The nitride layer is used as a hard mask during a second etch step to form the gate by transferring the gate pattern to the gate material layer via the second etch step.

28 Claims, 11 Drawing Sheets

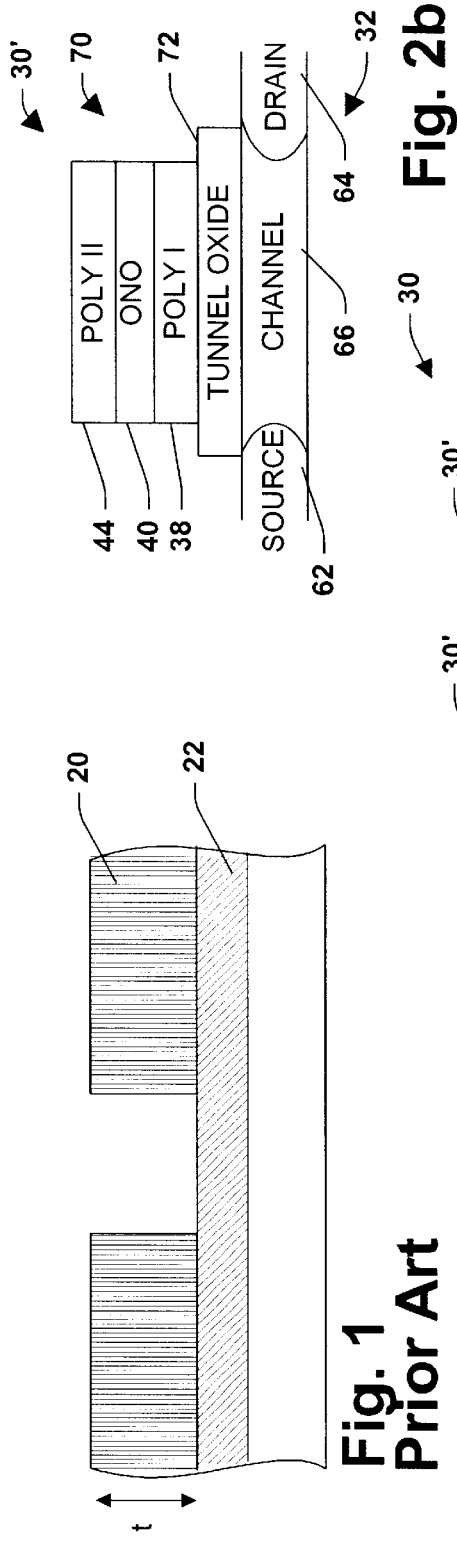
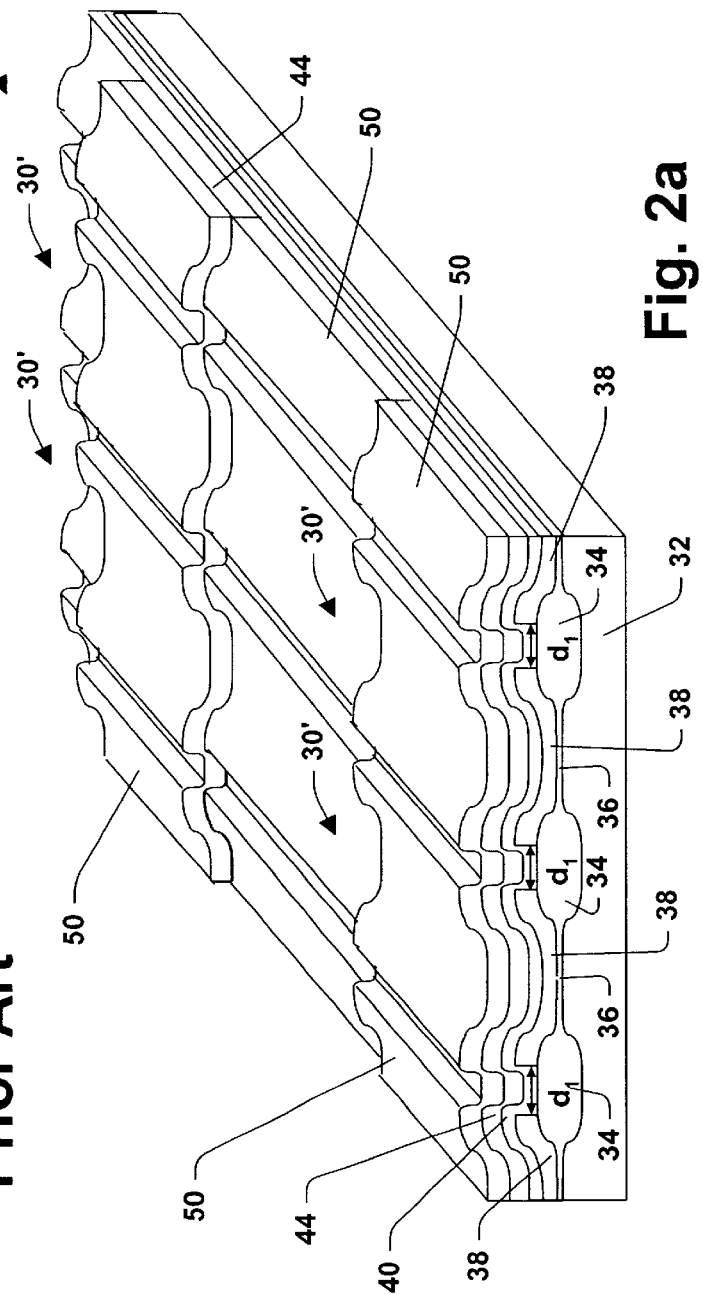
Fig. 1 Prior Art
Fig. 2a
Fig. 2b

THIN RESIST WITH NITRIDE HARD MASK FOR GATE ETCH APPLICATION

TECHNICAL FIELD

The present invention generally relates to photolithography, and more particularly relates to a method of forming sub-micron gates using short wavelength radiation and ultra-thin photoresists.

BACKGROUND OF THE INVENTION

In the semiconductor industry, there is a continuing trend toward higher device densities. To achieve these high densities, there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and size of memory cells, and surface geometry of various features such as corners and edges.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, x-rays, or an electron beam) illuminates selected areas of the surface through an intervening master template, the mask, for a particular pattern. The photoresist receives a projected image of the subject pattern. Once the image is projected, it is indelibly formed in the photoresist. The projected image may be either a negative or a positive image of the subject pattern. Exposure of the photoresist through a photomask causes the image area to become either more or less soluble (depending on the coating) in a particular solvent developer. The more soluble areas are removed in the developing process to leave the pattern image in the photoresist as less soluble polymer.

Projection lithography is a powerful and essential tool for microelectronics processing. As feature sizes are driven smaller and smaller, optical systems are approaching their limits caused by the wavelengths of the optical radiation. A recognized way of reducing the feature size of circuit elements is to lithographically image the features with radiation of a shorter wavelength. "Long" or "soft" x-rays (extreme ultraviolet (EUV), deep ultraviolet (DUV)), wavelength range of 5–200 nm are now at the forefront of research in an effort to achieve the smaller desired feature sizes.

Although EUV lithography provides substantial advantages with respect to achieving high resolution patterning, the shorter wavelength radiation is highly absorbed by the photoresist material. Consequently, the penetration depth of the radiation into the photoresist is limited. The limited penetration depth of the shorter wavelength radiation requires the use of ultra-thin photoresists so that the radiation can penetrate the entire depth of the photoresist in order to effect patterning thereof. However, the thinness of such ultra-thin photoresists results in the etch resistance thereof being relatively low. In other words, the etch protection afforded by ultra-thin photoresists is limited which in turn limits the EUV lithographic process.

SUMMARY OF THE INVENTION

The present invention relates to a method to facilitate lithographic processes employing extreme ultra-violet (EUV) radiation and/or deep UV radiation in fabricating gates. As noted above, EUV and deep UV radiation are preferred radiation sources in lithographic processes where fine resolution is desired. The short wavelengths of these types of radiation afford for fine patterning (e.g., critical feature sizes <0.25 μm). However, these types of radiation are highly absorbed by photoresist material which consequently limits the depth of penetration by the radiation into the photoresist material.

By employing a nitride layer to be patterned as a hard mask for use in connection with etching the gates, the present invention affords for expanding available etch chemistries useable in EUV and/or deep UV lithographic processes. In particular, these types of lithographic processes require the use of very thin photoresists as a result of the depth of penetration limitations of the short wavelength radiation. Such very thin photoresists are limited in their capacity as etch barriers due to the thickness thereof.

In the present invention, the ultra-thin photoresist is employed in patterning and etching the nitride thereunder to form a hard mask. A gate pattern formed in the photoresist with the short wavelength radiation is transferred to the nitride layer by a first etch step. The patterned nitride layer is used as a hard mask for a subsequent second etch step to etch a gate material layer (e.g., polysilicon or metal) so as to form a gate corresponding to the gate pattern. This methodology is used in conjunction with fabrication steps employed in making the particular device(s) (e.g., memory cells, analog devices) using the gate. Thus, the present invention affords for taking advantage of the fine resolution patterning available from EUV and deep UV lithographic processes and mitigates the limitations associated therewith with respect to etch chemistry.

One specific aspect of the present invention relates to a method of forming a gate structure. In the method, a nitride layer is formed on a gate material layer. An ultra-thin photoresist layer is formed on the nitride layer. The ultra-thin photoresist layer is patterned with short wavelength radiation to define a pattern for the gate. The ultra-thin photoresist layer is used as a mask during a first etch step to transfer the gate pattern to the nitride layer. The first etch step includes an etch chemistry that is selective to the nitride layer over the ultra-thin photoresist layer. The nitride layer is used as a hard mask during a second etch step to form the gate by transferring the gate pattern to the gate material layer via the second etch step.

Another specific aspect of the present invention relates to a memory cell structure including a plurality of memory cells, each of the memory cells including a floating gate, at least two of the floating gates being separated by a distance below about 0.18 μm. In forming the memory cell structure a first nitride layer is formed on a first gate material layer. A first ultra-thin photoresist layer is formed on the first nitride layer. The ultra-thin photoresist layer is patterned with short wavelength radiation to define a pattern for the floating gates. The ultra-thin photoresist layer is used as a mask during a first etch step to transfer the floating gate pattern to the first nitride layer. The first etch step includes an etch chemistry that is selective to the first nitride layer over the first ultra-thin photoresist layer. The first nitride layer is used as a hard mask during a second etch step to form the floating gates by transferring the floating gate pattern to the first gate material layer via the second etch step. An interpoly dielectric layer is formed over the floating gates. A second gate material layer is formed over the interpoly dielectric layer. A second nitride layer is formed on the second gate material layer. A second ultra-thin photoresist layer is formed on the second nitride layer. The second ultra-thin photoresist layer is patterned with short wavelength radiation to define a pattern for control gates. The second ultra-thin photoresist layer is used as a mask during a third etch step to transfer the control gate pattern to the second nitride layer. The third etch step includes an etch chemistry that is selective to the second nitride layer over the second ultra-thin photoresist layer. The second nitride layer is used as a hard mask during a fourth etch step to form the control gates by transferring the control gate pattern to the second gate material layer via the fourth etch step.

Still another aspect of the present invention relates to a method of forming a gate. A nitride layer is formed on a gate material layer, the nitride layer having a thickness within the range of 50 Å–2000 Å. An ultra-thin photoresist layer is formed on the nitride layer, the ultra-thin photoresist layer having a thickness within the range of 50 Å–2000 Å. The ultra-thin photoresist layer is patterned with short wavelength radiation to define a pattern for the gate, the short wavelength radiation falling within the range of about 11 nm to 13 nm. The ultra-thin photoresist layer is used as a mask during a first etch step to transfer the gate pattern to the nitride 1 layer. The first etch step includes an etch chemistry that is selective to the nitride layer over the ultra-thin photoresist layer. The nitride layer is used as a hard mask during a second etch step to form the gate by transferring the gate pattern to the gate material layer via the second etch step.

Another aspect of the present invention relates to a method for fabricating a memory cell structure. A first nitride layer is formed on a first gate material layer. A first ultra-thin photoresist layer is formed on the first nitride layer. The ultra-thin photoresist layer is patterned with short wavelength radiation to define a pattern for the floating gates. The ultra-thin photoresist layer is used as a mask during a first etch step to transfer the floating gate pattern to the first nitride layer. The first etch step includes an etch chemistry that is selective to the first nitride layer over the first ultra-thin photoresist layer. The first nitride layer is used as a hard mask during a second etch step to form the floating gates by transferring the floating gate pattern to the first gate material layer via the second etch step. An interpoly dielectric layer is formed over the floating gates. A second gate material layer is formed over the interpoly dielectric layer. A second nitride layer is formed on the second gate material layer. A second ultra-thin photoresist layer is formed on the second nitride layer. The second ultra-thin photoresist layer is patterned with short wavelength radiation to define a pattern for control gates. The second ultra-thin photoresist layer is used as a mask during a third etch step to transfer the control gate pattern to the second nitride layer. The third etch step includes an etch chemistry that is selective to the second nitride layer over the second ultra-thin photoresist layer. The second nitride layer is used as a hard mask during a fourth etch step to form the control gates by transferring the control gate pattern to the second gate material layer via the fourth etch step.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a prior art schematic cross-sectional illustration of a conventional patterned resist used in the formation of gates;

FIG. 2a is a perspective illustration of a memory cell structure formed in accordance with one aspect of the present invention;

FIG. 2b is a schematic illustration of a stacked gate memory cell in accordance with one aspect of the present invention;

DETAILED DESCRIPTION OF THE INVENTION

Figure 3:
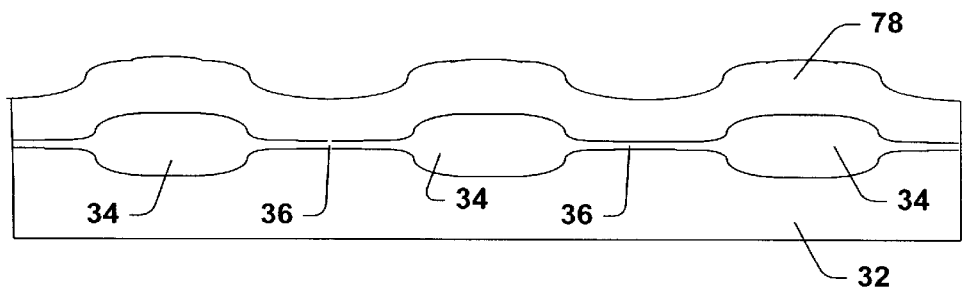
FIG. 3 is a schematic cross-sectional illustration of a substrate including field oxide and channel regions with a poly I layer formed thereon in accordance with one aspect of the present invention.

The present invention will now be described with reference to the drawings, wherein like reference numerals are used to refer to like elements throughout. The method of the present invention will be described with reference to the formation of gates using a photolithographic process employing radiation of short wavelength (e.g., EUV radiation and/or deep UV radiation) and an ultra-thin photoresist. The following detailed description is of the best modes presently contemplated by the inventors for practicing the invention. It should be understood that the description of these preferred embodiments are merely illustrative and that they should not be taken in a limiting sense. Furthermore, although the present invention is described primarily within the context of forming memory cells and gates thereof, it is to be appreciated that the present invention may be applied to forming other gates (e.g., analog gate, gates for other types of memory cells), and such applications are intended to fall within the scope of the present invention.

FIG. 1 is a cross-sectional illustration of a conventional photoresist layer 20 being used in the formation of gate(s). As shown, the photoresist layer 20 is substantially thick (e.g., 5,000–10,000 Å). The photoresist layer 20 is shown patterned so as to define a gate which will be etched into an underlying gate material layer 22 so as to form the gate. However, the thickness of the photoresist layer 20 is not conducive for use with short wavelength radiation because these types of radiation would be highly absorbed by the photoresist layer 20 and not penetrate the entire thickness "t" of the layer 20. As a result, such a conventional scheme for forming a gate would not be able to take advantage of the improved resolution of patterning offered by the short wavelength radiation.

Turning now to the present invention in detail, FIG. 2a illustrates a memory device 30 including a plurality of memory cells 30' formed in accordance with the present invention. The memory device 30 includes a substrate 32, which comprises regions of thick oxide (field oxide) 34 and thin oxide (tunnel oxide) 36. The field oxide 34 provides for electrically insulating transistors from one another. Although only a few memory cells 30' are shown for ease of understanding, it is to be appreciated that the memory cell structure 30 may include thousands or even millions of such memory cells 30'. The memory cells 30' include a floating gate 38 (e.g., poly I gate, alternatively a first metal gate), an interpoly dielectric layer 40, a control gate 44 (e.g., poly II gate, alternatively a second metal gate), and a protective capping layer 50. Through the use of short wavelength radiation and an ultra-thin photoresist, the present invention provides for forming the memory cells 30' substantially close together. More particularly, a distance "$d_1$" between the floating gates 38 of adjacent memory cells 30' may be less than 0.251 μm.

FIG. 2b is a schematic illustration of the memory cell 30' which typically includes a source 62, a drain 64, and a channel 66 in the substrate 30; and a stacked gate structure 70 overlying the channel 66. The stacked gate 70 includes a thin gate dielectric layer 72 (commonly referred to as the tunnel oxide) formed on the surface of the substrate 32. The tunnel oxide layer 72 coats a portion of the top surface of the silicon substrate 32 and serves to support an array of different layers directly over the channel 66. The stacked gate 70 includes the lower most or first film layer 38, such as doped polycrystalline silicon (polysilicon or poly I) layer or first metal layer (e.g., Cu, Al) which serves as the floating gate 38 that overlies the tunnel oxide 72. On top of the first gate material layer 38 is the interpoly dielectric layer 40. The interpoly dielectric layer 40 is preferably a multilayer insulator such as an oxide-nitride-oxide (ONO) layer having two oxide layers sandwiching a nitride layer, or as an alternative can be another dielectric layer such as tantalum pentoxide. Finally, the stacked gate 70 includes the second gate material layer 44 (e.g., second polysilicon layer (poly II) which serves as a polysilicon control gate, or second metal layer such as Cu or Al) overlying the ONO layer 40. The control gates 44 of the respective memory cells 30' that are formed in a given row share a common word line (WL) associated with the row of cells. In addition, the drain regions 64 of the respective cells are connected together by a conductive bit line (BL). The channel 66 of the cell 30' conducts current between the source 62 and the drain 64 in accordance with an electric field developed in the channel 66 by the stacked gate structure 70.

The memory cell 30' (e.g., flash memory cell) operates in the following manner. The memory cell 30' is programmed by applying a relatively high voltage $V_G$ (e.g. approximately 12 volts) to the control gate 44 and a moderately high voltage $V_D$ (e.g., approximately 9 volts) to the drain 64 in order to produce "hot" (high energy) electrons in the channel 66 near the drain 64. The hot electrons accelerate across the tunnel oxide 72 and into the floating gate 38 and become trapped in the floating gate 38 because the floating gate 38 is surrounded by insulators (the interpoly dielectric 40 and the tunnel oxide 72). As a result of the trapped electrons, a threshold voltage ($V_T$) of the memory cell 30' increases by about 3 to 5 volts. This change in the threshold voltage (and thereby the channel conductance) of the memory cell 30' created by the trapped electrons is what causes the memory cell 30' to be programmed.

To read the memory cell 30', a predetermined voltage $V_G$ that is greater than the threshold voltage of an unprogrammed memory cell, but less than the threshold voltage of a programmed memory cell, is applied to the control gate 44. If the memory cell 30' conducts, then the memory cell 30' has not been programmed (the memory cell 30' is therefore at a first logic state, e.g., a zero "0"). Conversely, if the memory cell 30' does not conduct, then the memory cell 30' has been programmed (the memory cell 30' is therefore at a second logic state, e.g., a one "1"). Thus, each memory cell 30' may be read in order to determine whether it has been programmed (and therefore identify the logic state of the memory cell 30').

In order to erase the memory cell 30', a relatively high voltage $V_S$ (e.g, approximately 12 volts) is applied to the source 62 and the control gate 44 is held at a ground potential ($V_G$=0), while the drain 64 is allowed to float. Under these conditions, a strong electric field is developed across the tunnel oxide 72 between the floating gate 38 and the source region 62. The electrons that are trapped in the floating gate 38 flow toward and cluster at the portion of the floating gate 38 overlying the source region 62 and are extracted from the floating gate 38 and into the source region 62 by way of Fowler-Nordheim tunneling through the tunnel oxide 72. Consequently, as the electrons are removed from the floating gate 38, the memory cell 30' is erased.

Having described a structural arrangement of the memory cell 30', attention is now brought to fabrication of the memory device 30 in accordance with the novel photolithographic process of the present invention.

The gates 38 and 44 are formed employing photolithographic techniques utilizing short wavelength radiation and ultra-thin photoresists. Accordingly, substantially smaller dimensions of the gates 38 and 44 are achieved as compared to gates formed in accordance with the prior art technique discussed with respect to FIG. 1. Furthermore, the distance "$d_1$" between adjacent memory cells 30' is also substantially less than that of conventionally fabricated memory cells. For example, the gates 38 and 44 may have respectively a critical feature dimension of less than about 0.25 μm, and such small dimension is not typically obtainable using conventional lithographic processes. In another embodiment, the gates 38, 44 may have respectively a critical feature dimension of less than about 0.18 μm. Likewise, the distance "$d_1$" between adjacent memory cells may be less than 0.25 μm. In another embodiment, the distance "$d_1$" may be less than about 0.18 μm.

Figure 4:
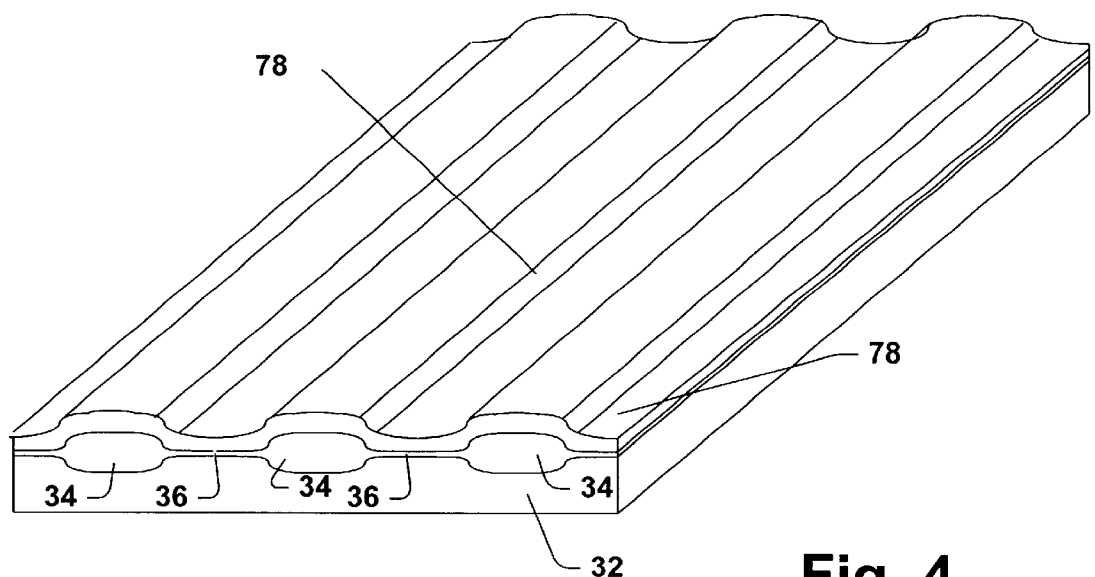
FIG. 4 is a perspective view of the structure of FIG. 3.

Turning now to FIGS. 3–31, the fabrication of the gates 38 and 44 and corresponding memory cells 30' is discussed in greater detail. FIG. 3 illustrates an overall arrangement of the memory device 30 at an early stage of formation. The substrate 32 is shown which comprises the field oxide regions 34 and the thin oxide regions 36. It should be appreciated that although specific layering materials are identified in the preferred embodiment, any materials suitable for carrying out the present invention may be employed and fall within the scope of the claims. A first gate material layer 78 (which may comprise doped polycrystalline silicon (polysilicon or poly I) or a metal such a Cu or Al, for example) is shown laid down over the substrate 32. FIG. 4 is a perspective illustration of the partially complete memory device structure of FIG. 3.

Figure 5:
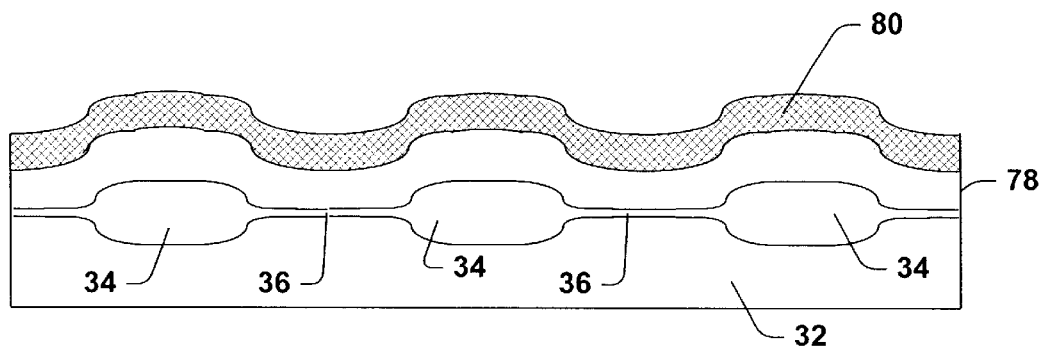
FIG. 5 is a schematic cross-sectional illustration of a nitride layer formed over the first gate material layer of FIGS. 3 and 4 in accordance with one aspect of the present invention.

Turning now to FIG. 5, a first nitride layer 80 is formed over the first gate material layer 78. The nitride layer 80 will serve as a hard mask during etching of the underlying first gate material layer 78. Any suitable technique for forming the nitride layer 80 may be employed such as Low Pressure Chemical Vapor Deposition (LPCVD), Plasma Enhanced Chemical Vapor Deposition (PECVD), High Density Chemical Plasma Vapor Deposition (HDPCVD), sputtering or high density plasma chemical vapor deposition (HDPCVD) techniques to a thickness suitable for serving as a hard mask for a selective etch of the first gate material layer 78. Thus, for example, in one aspect of the present invention the thickness of the nitride layer 80 is between the range of about 50 Å–5000 Å. In another aspect, the thickness of the nitride layer 80 is between the range of about 50 Å–3000 Å. In another aspect, the thickness of the nitride layer 80 is between the range of about 50 Å–2000 Å. In another aspect, the thickness of the nitride layer 80 is between the range of about 50 Å–1500 Å. In another aspect, the thickness of the nitride layer 80 is between the range of about 50 Å–1000 Å. In still another aspect, the thickness of the nitride layer 80 is between the range of about 50 Å–500 Å.

Figure 6:
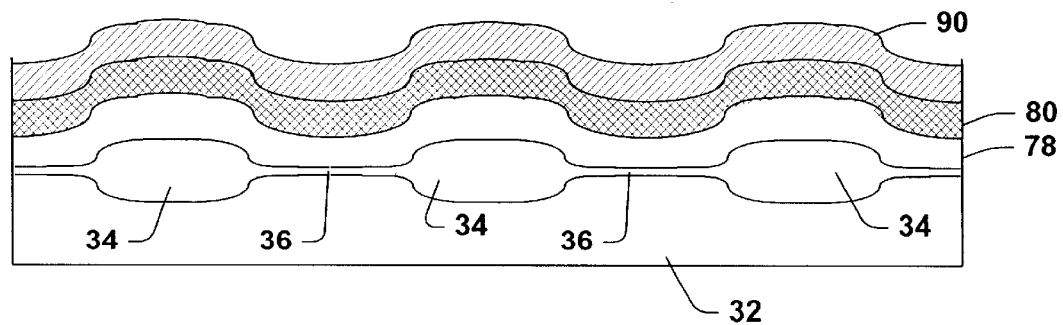
FIG. 6 is a schematic cross-sectional illustration of an ultra-thin photoresist layer formed over the nitride layer of FIG. 5 in accordance with one aspect of the present invention.

FIG. 6 illustrates an ultra-thin photoresist layer 90 formed over the nitride layer 70. The ultra-thin photoresist layer 90 has a thickness of about 500 Å–5000 Å, however, it is to be appreciated that the thickness thereof may be of any dimension suitable for carrying out the present invention. Accordingly, the thickness of the ultra-thin photoresist 90 can vary in correspondence with the wavelength of radiation used to pattern the ultra-thin photoresist 90. One aspect of the present invention provides for forming the ultra-thin photoresist layer 90 to have a thickness within the range of 1000 Å to 4000 Å. Another aspect of the present invention provides for forming the ultra-thin photoresist layer 90 to have a thickness within the range of 2000 Å to 3000 Å. Yet another aspect of the present invention provides for forming the ultra-thin photoresist layer 90 to have a thickness within the range of 500 Å to 2000 Å. The ultra-thin photoresist 80 may be formed over the nitride layer 80 via conventional spin-coating or spin casting deposition techniques.

The ultra-thin photoresist layer 90 has a thickness suitable for functioning as a mask for etching the underlying nitride layer 80 and for forming patterns or openings in the developed ultra-thin photoresist layer 90 that are 0.25 μm or less. Since the ultra-thin photoresist layer 90 is relatively thin compared with I-line, regular deep UV and other photoresists, improved critical dimension control is realized.

Ultra-thin resists are processed using small wavelength radiation. Small wavelength radiation increases precision and thus the ability to improve critical dimension control. Specific examples of wavelengths to which the ultra-thin photoresist 90 is sensitive (undergo chemical transformation enabling subsequent development) include about 248 nm, about 193 nm, about 157 nm, about 13 nm, about 11 nm, and as low as 4 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, and EUV having a wavelength of about 15 nm to about 10 nm, and as low as 4 nm.

Positive or negative ultra-thin photoresists may be employed in the methods of the present invention. An example of a deep UV chemically amplified photoresist is a partially t-butoxycarbonyloxy substituted poly-p-hydroxystyrene. Photoresists are commercially available from a number of sources, including Shipley Company, Hoechst Celanese Corporation, and Brewer. The scope of the present invention as defined by the hereto appended claims is intended to include any ultra-thin photoresist suitable for carrying out the present invention.

Figure 7:
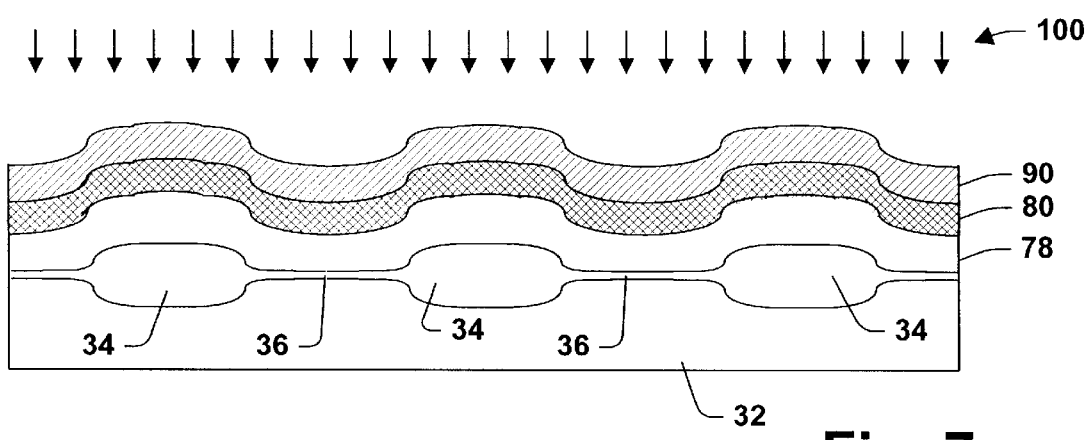
FIG. 7 is a schematic cross-sectional illustration of the ultra-thin photoresist layer of FIG. 6 undergoing a patterning step in accordance with one aspect of the present invention.
Figure 8:
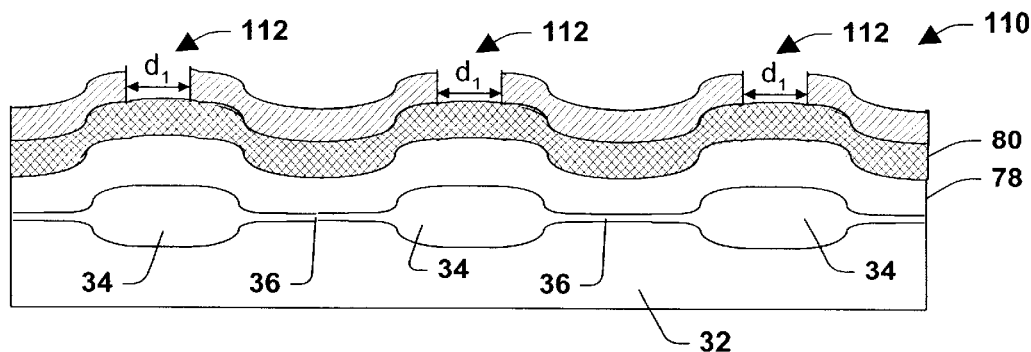
FIG. 8 is a schematic cross-sectional illustration of the ultra-thin photoresist layer of FIG. 7 after the patterning step is substantially complete in accordance with one aspect of the present invention.

Referring to FIG. 7, the ultra-thin photoresist layer 90 then undergoes an exposure/development step 100 to provide a patterned photoresist 110 (FIG. 8). The patterned photoresist 110 is formed using electromagnetic radiation having a relatively small wavelength (for example, less than 200 nm). In this embodiment, electromagnetic radiation having a wavelength of about 13 nm is employed. Since relatively small wavelengths are used, reflectivity concerns are minimized because larger wavelengths are more frequently associated with reflectivity problems. As a result, the present invention does not require the use of an anti-reflective coating (ARC) to mitigate standing wave problems associated with conventional lithographic processes. The ultra-thin photoresist layer 90 is selectively exposed to radiation; that is, selected portions of the ultra-thin photoresist layer 90 are exposed to radiation. Either the exposed or unexposed portions of the ultra-thin photoresist layer 90 are removed or developed to provide the patterned photoresist 110.

The critical feature dimension "$d_1$" of the exposed portion of the nitride layer 80 (opening 112 in the patterned photoresist 110) is about 0.25 $\mu$m or less, including about 0.18 $\mu$m or less, about 0.09 $\mu$m or less, about 0.075 $\mu$m or less and about 0.05 $\mu$m or less, depending on the wavelength of the radiation used.

The selectively exposed ultra-thin photoresist layer 90 is developed by contact with a suitable developer that removes either the exposed or unexposed portions of the ultra-thin photoresist layer 90. The identity of the developer depends upon the specific chemical constitution of the ultra-thin photoresist layer 90. For example, an aqueous alkaline solution may be employed to remove unexposed portions of the ultra-thin photoresist layer 90. Alternatively, one or more of dilute aqueous acid solutions, hydroxide solutions, water, and organic solvent solutions may be employed to remove selected portions of the ultra-thin photoresist layer 90. The developer is selected so that it does not degrade or etch the material of the nitride layer 80, or at least degrades or etches the material of the nitride I layer 80 at a substantially slower rate as compared to the rate that the material of the ultra-thin photoresist layer 90 is developed. In other words, the nitride layer 80 serves as an etch-stop layer when developing the ultra-thin photoresist layer 90.

The patterned photoresist 110 may assume any suitable pattern, but typically the patterned photoresist 110 corresponds to the desired gate pattern. In the present invention, the patterned photoresist 110 defines one or more gates. The patterned photoresist 110 defines one or more openings 112 over the nitride layer 80 corresponding to isolation regions between the floating gate(s) 38 (FIG. 2) to be formed. The patterned photoresist 110 serves as an etch mask layer for processing or etching the underlying nitride layer 80.

Figure 9:
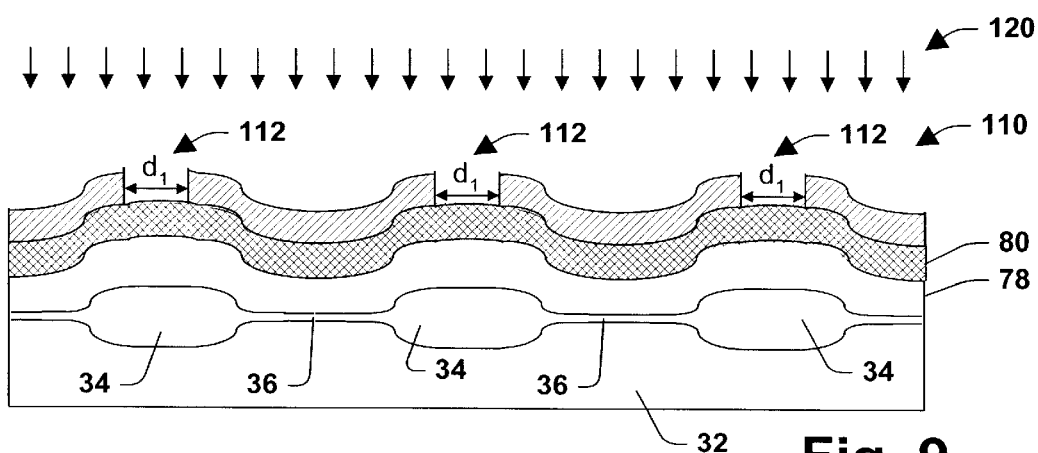
FIG. 9 is a schematic cross-sectional illustration of the nitride layer of FIG. 8 undergoing an etching step in accordance with one aspect of the present invention.
Figure 10:
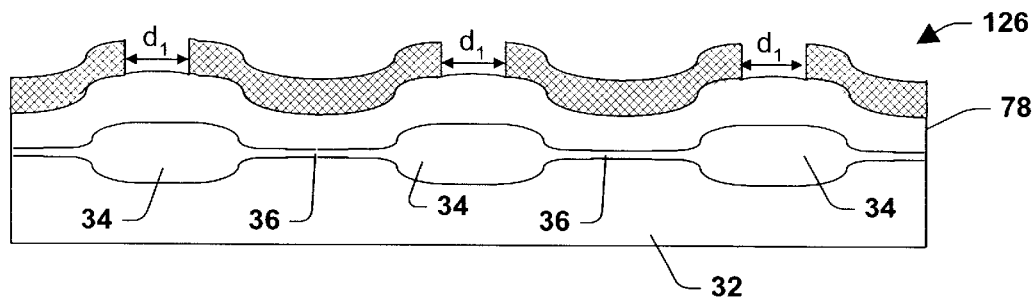
FIG. 10 is a schematic cross-sectional illustration of the nitride layer of FIG. 9 after the etching step is substantially complete in accordance with one aspect of the present invention.

Referring now to FIG. 9, the patterned photoresist 110 is used as a mask for selectively etching the nitride layer 80 to provide patterned nitride layer 110 (FIG. 10) from a first etch step 120. Any suitable etch technique may be used to etch the nitride layer 80. Preferably, a selective etch technique may be used to etch the material of the nitride layer 80 at a relatively greater rate as compared to the rate that the material of the patterned photoresist 90 is etched. The first etch step 120 is also highly selective to the nitride layer 80 over the underlying first gate material layer 78 so as to mitigate damage to the first gate material layer 78.

Preferably, the nitride layer 80 is etched using an anisotropic etching process—dry or wet etching techniques may be employed, although dry etching is preferred. A nitride-:photoresist etch technique may be used to etch the nitride layer 80 to provide the patterned nitride layer 126 and continue to define opening 112 exposing portions of the first gate material layer 78 lying under the patterned nitride layer 110. The nitride:photoresist etch selectivity may be within the range of 2:1 to greater than 40:1, and one skilled in the art could readily tailor a suitable etch chemistry to correspond to the characteristics of the nitride layer 80 and the patterned photoresist 110. For example, using the patterned photoresist 110 as a mask, the nitride layer 80 may be etched using magnetic enhanced reactive ion etching (MERIE) with $CH_3F$ chemistry that will not substantially attack the underlying first gate material layer 78. According to the present example, a MERIE method is used with reactant gases of $CH_3F$ (20–100 sccm) and $O_2$ (50–200 sccm) at a power level within the range of about 500–1000 W, and pressure within the range of about 20–200 mT. This chemistry has very high selectivity to the nitride material over the photoresist material and the selectivity of various embodiments, respectively, may be tailored to be greater than 5:1; greater than 10:1; greater than 20:1; greater than 30:1; and greater than 40:1 depending on the particular embodiment employed.

Figure 11:
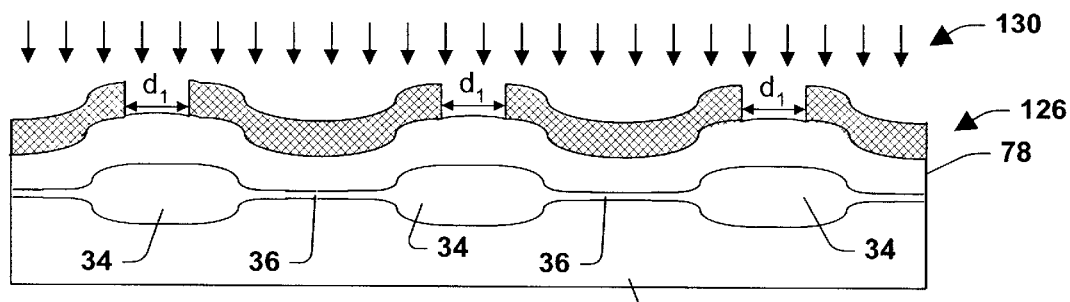
FIG. 11 is a schematic cross-sectional illustration of the poly I layer of FIG. 10 undergoing an etching step in accordance with one aspect of the present invention.
Figure 12:
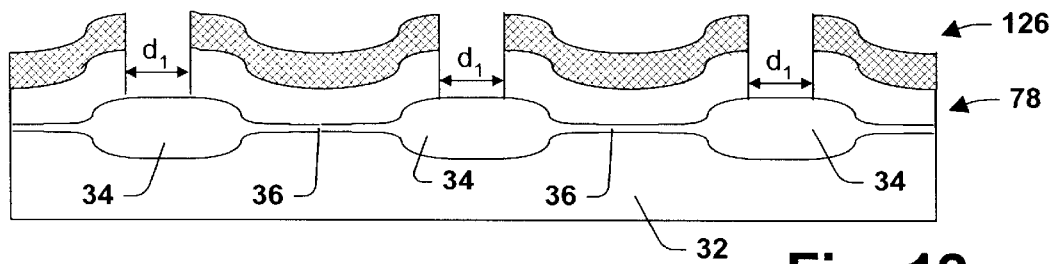
FIG. 12 is a schematic cross-sectional illustration of the first gate material layer of FIG. 11 after the etching step is substantially complete in accordance with one aspect of the present invention.

Turning now to FIG. 11, the first gate material layer 78 is shown undergoing an etching process 130 wherein the patterned nitride layer 126 serves a hard mask thereto. For example, the etching process 130 may include a reactive ion etch (RIE), that is highly selective to the first gate material layer 78 with respect to the patterned nitride layer 126. It is to be appreciated that any suitable etch methodology for selectively etching the first gate material layer 78 over the patterned nitride layer 126 may be employed and is intended to fall within the scope of the hereto appended claims. For example, in the case where the first gate material 78 comprises polysilicon, the etch process 130 may include using a MERIE system with power within the range of about 300 W to 2000 W; pressure within the range of about 20 mT to 100 mT; and a gas chemistry including HBr at about 50 sccm to 200 sccm; He at about 0 sccm to 100 sccm; $O_2$ at about 0 sccm to 20 sccm; $Cl_2$ at about 0 sccm to 100 sccm and Ar at about 0 sccm to 100 sccm. The selectivity to the poly I layer 78 over the hard mask 126 may range from 5:1 to greater than 40:1. Any remaining ultra-thin photoresist 110 (not shown) will be removed as well during the etch process 130 partly because of its thinness and inability to serve as a sole etch barrier for the poly I layer etch 130. However, if desired the ultra-thin photoresist 110 may be completely stripped away prior to performing the etch process 130. FIG. 12 illustrates the poly I layer 78 after the etch process 130 is substantially complete.

In the case where the first gate material layer 78 comprises a metal such as Cu, Al, Ta, TaN, Ti or TiN, the first gate material layer 78 may be etched with $Cl_2$ chemistry using magnetic enhanced reactive ion etching (MERIE), electron cyclotron etching (ECR), or conventional reactive ion etching (RIE) methods. According to the present example, a MERIE method is used with reactant gases of $Cl_2$ (30–200 sccm) and $BCL_3$ (10–200 sccm) at a power level within the range of about 300–800 W, and pressure within the range of about 60–400 mT. This chemistry has reasonably high selectivity to the metal material over the nitride material, and the selectivity of various embodiments, respectively, may be tailored to be greater than 5:1; greater than 6:1; greater than 7:1; greater than 8:1; greater than 9:1; and greater than 10:1 depending on the particular embodiment employed.

Figure 13:
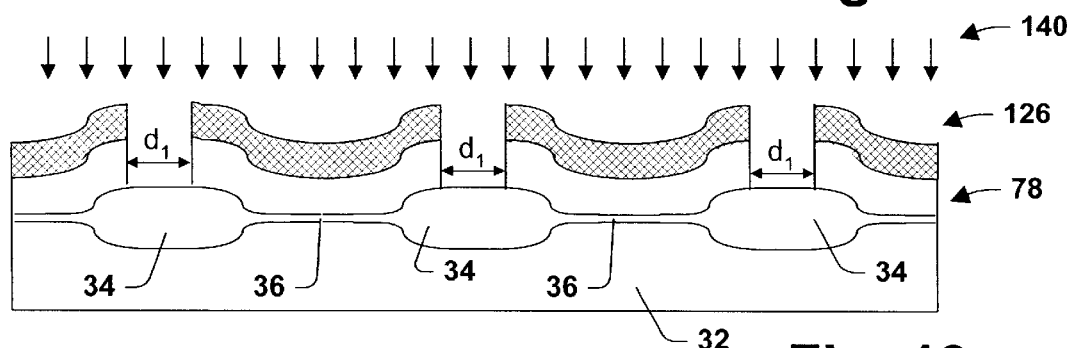
FIG. 13 is a schematic cross-sectional illustration of the nitride hard mask of FIG. 12 undergoing a stripping process in accordance with one aspect of the present invention.
Figure 14:
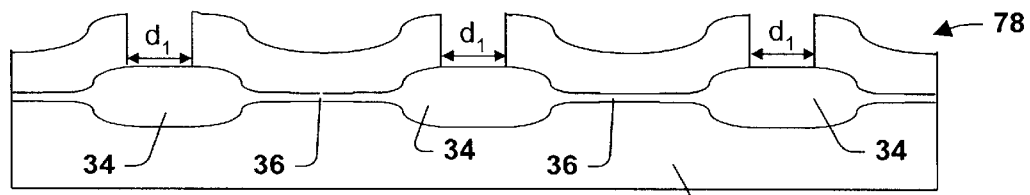
FIG. 14 is a schematic cross-sectional illustration of the structure of FIG. 13 after the nitride hard mask has been removed in accordance with one aspect of the present invention.
Figure 15:
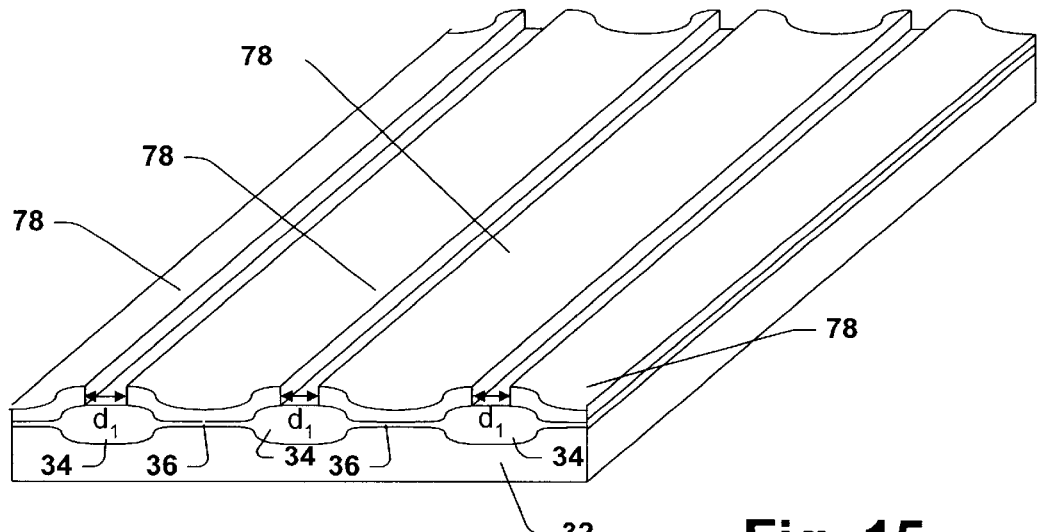
FIG. 15 is a perspective illustration of the structure of FIG. 14.

In FIG. 13, the hard mask 126 is shown undergoing a stripping process 140. Any suitable technique (e.g., using an oxidizing cleaning solution such as an ammonium hydroxide and hydrogen peroxide based solution (APM), or a sulfuric acid and hydrogen peroxide based solution (SPM)) may be employed to remove the nitride hard mask 126. FIGS. 14 and 15 illustrate in cross-section and perspective views, respectively, the partially complete memory cell structure after the hard mask 126 has been removed.

Figure 16:
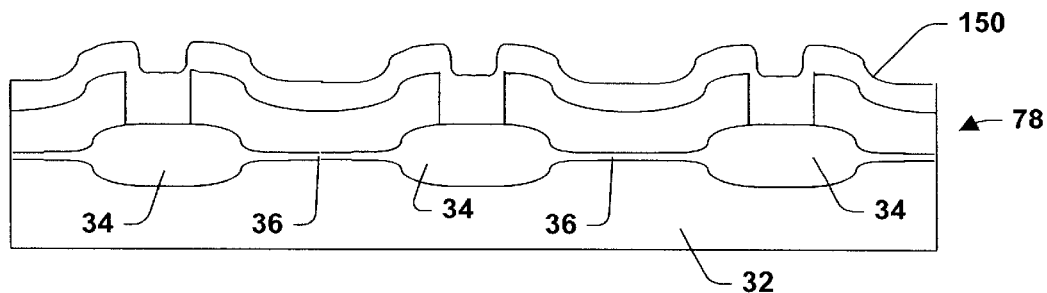
FIG. 16 is a schematic cross-sectional illustration of an ONO layer formed over the first gate material layer of FIGS. 14 and 15 in accordance with one aspect of the present invention.
Figure 17:
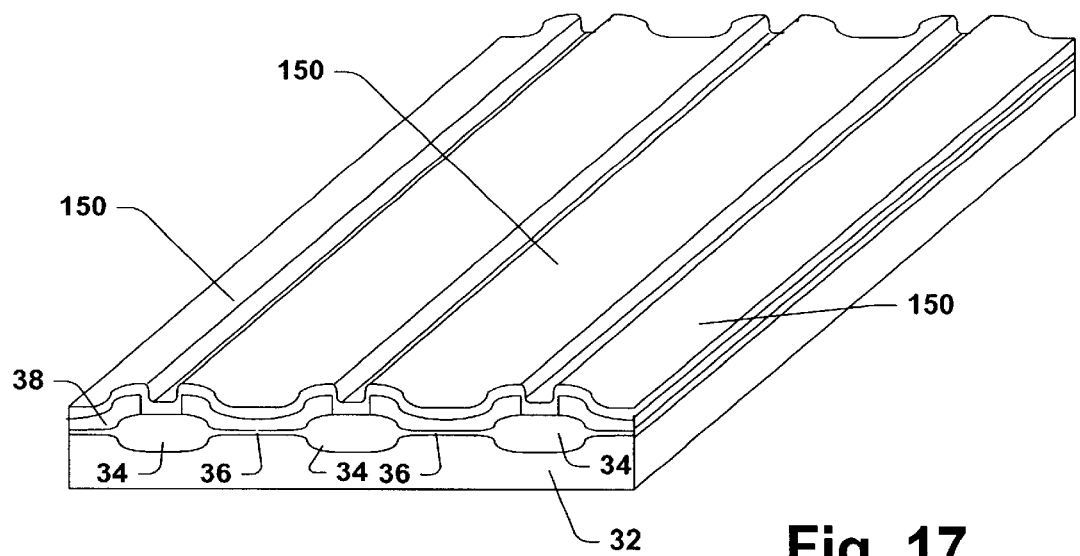
FIG. 17 is a perspective illustration of the structure of FIG. 15.

Turning now to FIGS. 16 and 17, an interpoly dielectric layer 150 is shown formed over the etched first gate material layer 78 and exposed field oxide regions 34. The interpoly dielectric layer 130 is preferably a multilayer insulator such as an oxidenitride-oxide (ONO) layer having two oxide layers sandwiching a nitride layer (e.g., $SiO_2$, $Si_3N_4$ and $SiO_2$ layers, respectively), or in the an alternative can be another dielectric layer such as tantalum pentoxide. Formation of interpoly dielectric layers in the fabrication of memory cells is well known, and therefore further discussion related thereto is omitted for sake of brevity.

Figure 18:
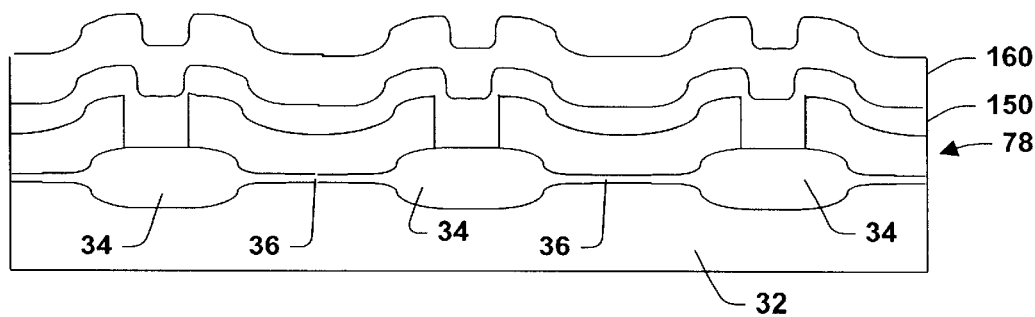
FIG. 18 is a schematic cross-sectional illustration of a second gate material layer formed over the ONO layer of FIGS. 16 and 17 in accordance with one aspect of the present invention.
Figure 19:
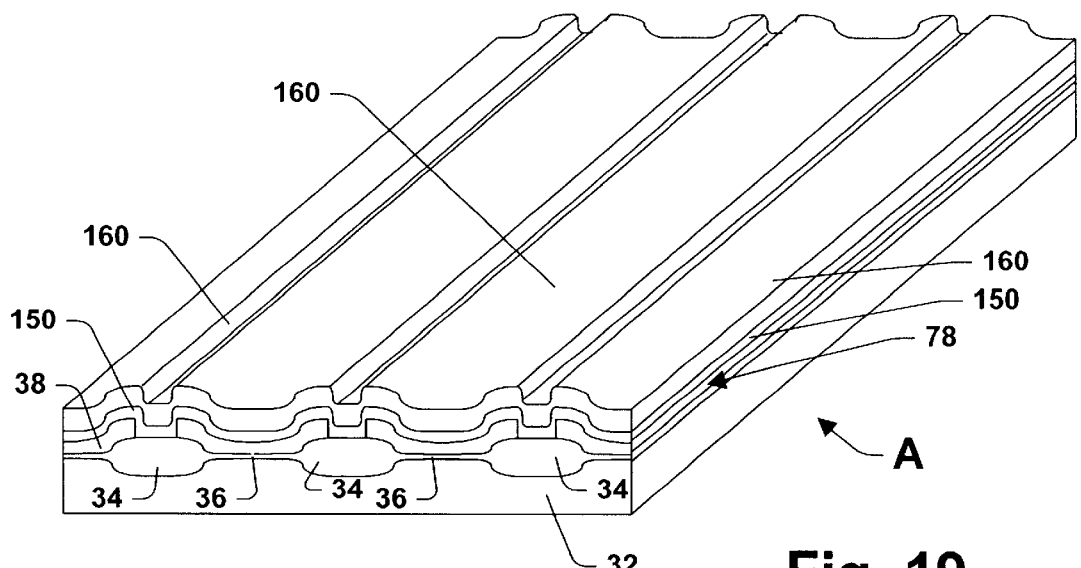
FIG. 19 is a perspective illustration of the structure of FIG. 18.
Figure 20:
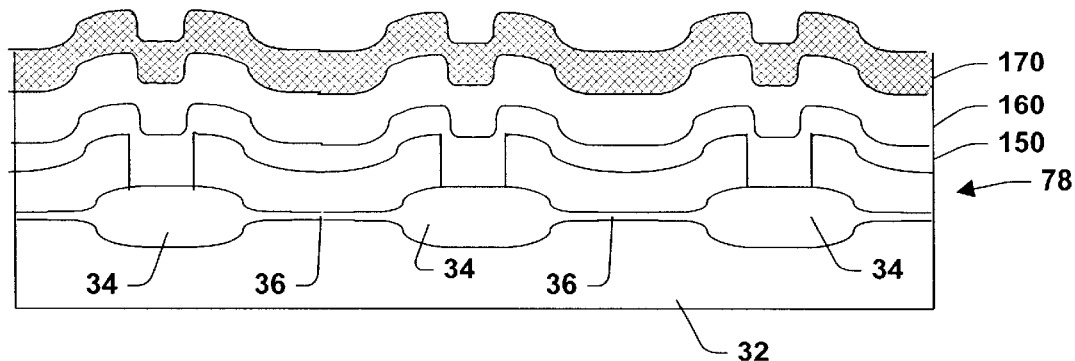
FIG. 20 is a schematic cross-sectional illustration of a nitride layer formed over the second gate material layer of FIGS. 18 and 19 in accordance with one aspect of the present invention.

FIGS. 18 and 19 illustrate a second gate material layer 160 formed over the ONO layer 150 via any of CVD, PECVD, HDCVD techniques, for example. FIG. 20 illustrates a second nitride layer 170 formed over the second gate material layer 160. The second nitride layer 170 will serve as a hard mask during etching of the underlying second gate material layer 160. Any suitable technique for forming the nitride layer 170 may be employed such as Low Pressure Chemical Vapor Deposition (LPCVD), Plasma Enhanced Chemical Vapor Deposition (PECVD), High Density Chemical Plasma Vapor Deposition (HDPCVD), sputtering or high density plasma chemical vapor deposition (HDPCVD) techniques to a thickness suitable for serving as a hard mask for a selective etch of the second gate material layer 160. Thus, for example, in one aspect of the present invention the thickness of the second nitride layer 170 is between the range of about 50 Å–5,000 Å. In another aspect, the thickness of the second nitride layer 170 is between the range of about 50 Å–3000 Å. In another aspect, the thickness of the second nitride layer 170 is between the range of about 50 Å–2000 Å. In another aspect, the thickness of the second nitride layer 170 is between the range of about 50 Å–1500 Å. In another aspect, the thickness of the second nitride layer 170 is between the range of about 50 Å–1000 Å. In still another aspect, the thickness of the second nitride layer 170 is between the range of about 50 Å–500 Å.

Figure 21:
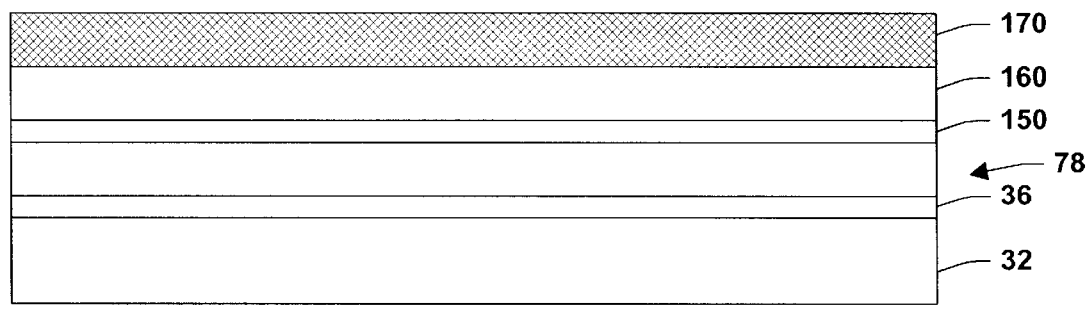
FIG. 21 is a schematic cross-sectional illustration of the structure of FIG. 20 from another direction in accordance with one aspect of the present invention.
Figure 22:
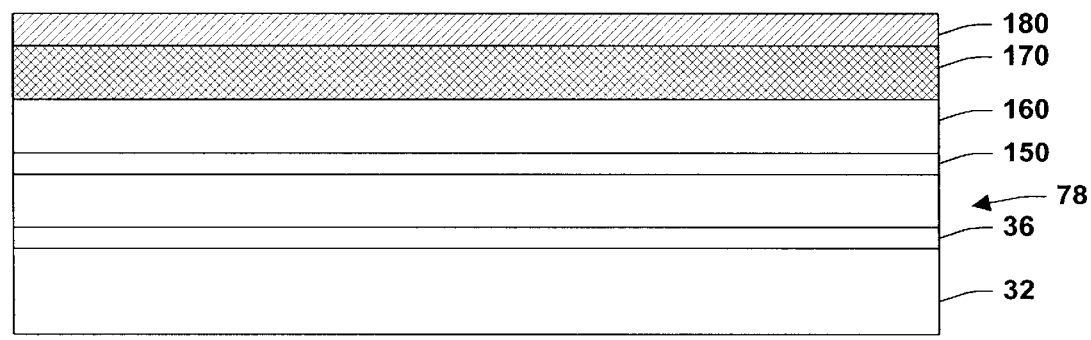
FIG. 22 is a schematic cross-sectional illustration of an ultra-thin photoresist layer formed over the nitride layer of FIG. 21 in accordance with one specific aspect of the present invention.

FIG. 21 is a cross-sectional illustration of the partially complete memory cell structure shown in FIG. 20 but from a direction "A" (FIG. 19). In FIG. 22, a second ultra-thin photoresist layer 180 is shown formed over the second nitride layer 170. The second ultra-thin photoresist layer 180 has a thickness of about 500 Å–5000 Å, however, it is to be appreciated that the thickness thereof may be of any dimension suitable for carrying out the present invention. Accordingly, the thickness of the second ultra-thin photoresist 180 can vary in correspondence with the wavelength of radiation used to pattern the second ultra-thin photoresist 180. One aspect of the present invention provides for forming the second ultra-thin photoresist layer 180 to have a thickness within the range of 1000 Å to 4000 Å. Another aspect of the present invention provides for forming the second ultra-thin photoresist layer 180 to have a thickness within the range of 2000 Å to 3000 Å. Yet another aspect of the present invention provides for forming the second ultra-thin photoresist layer 180 to have a thickness within the range of 500 Å to 2000 Å. The second ultra-thin photoresist 180 may be formed over the second nitride layer 170 via conventional spin-coating or spin casting deposition techniques.

The second ultra-thin photoresist layer 180 has a thickness suitable for functioning as a mask for etching the underlying second nitride layer 170 and for forming patterns or openings in the developed second ultra-thin photoresist layer 180 that are 0.25 μm or less. Since the second ultra-thin photoresist layer 180 is relatively thin compared with I-line, regular deep UV and other photoresists, improved critical dimension control is realized.

Specific examples of wavelengths to which the second ultra-thin photoresist 180 is sensitive include about 248 nm, about 193 nm, about 157 nm, about 13 nm, about 11 nm, and as low as 4 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, and EUV having a wavelength of about 15 nm to about 10 nm, and as low as 4 nm.

Figure 23:
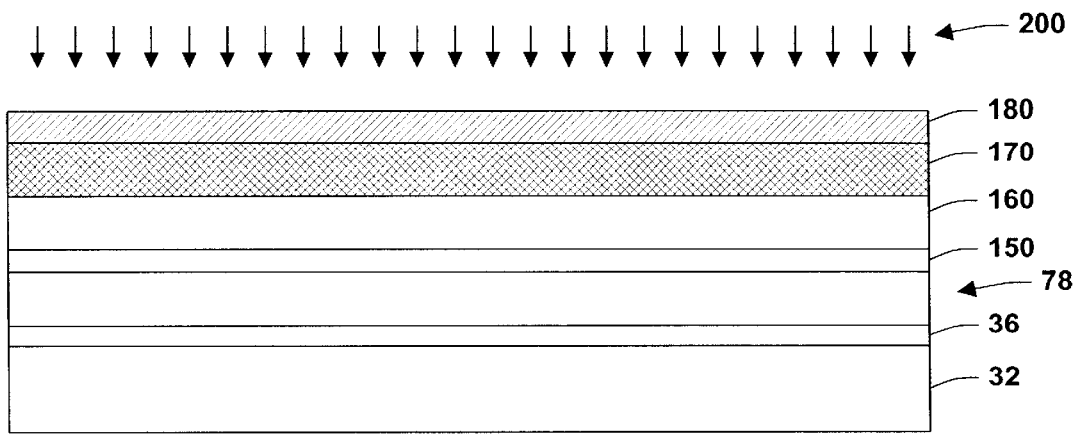
FIG. 23 is a schematic cross-sectional illustration of the ultra-thin photoresist layer of FIG. 22 undergoing a patterning step in accordance with one aspect of the present invention.
Figure 24:
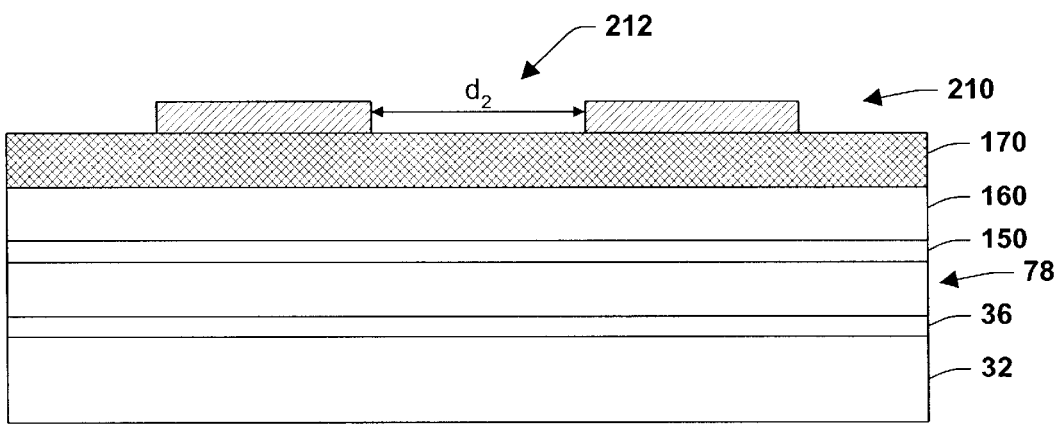
FIG. 24 is a schematic cross-sectional illustration of the ultra-thin photoresist layer of FIG. 23 after the patterning step is substantially complete in accordance with one aspect of the present invention.

Referring now to FIG. 23, the second ultra-thin photoresist layer 180 then undergoes an exposure/development step 200 to provide a patterned second ultra-thin photoresist 210 (FIG. 24). The patterned photoresist 210 is formed using electromagnetic radiation having a relatively small wavelength (for example, less than 200 nm). In this embodiment, electromagnetic radiation having a wavelength of about 13 nm is employed. As mentioned above, since relatively small wavelengths are used, reflectivity concerns are minimized because larger wavelengths are more frequently associated with reflectivity problems. As a result, the present invention does not require the use of an anti-reflective coating (ARC) to mitigate standing wave problems associated with conventional lithographic processes. The second ultra-thin photoresist layer 180 is selectively exposed to radiation; that is, selected portions of the second ultra-thin photoresist layer 190 are exposed to radiation. Either the exposed or unexposed portions of the second ultra-thin photoresist layer 180 are removed or developed to provide the patterned photoresist 210.

The critical feature dimension "$d_2$" of the exposed portion of the second nitride layer 170 (opening 212 in the patterned photoresist 210) may be about 0.25 μm or less, including about 0.18 μm or less, about 0.09 μm or less, about 0.075 μm or less and about 0.05 μm or less, depending on the wavelength of the radiation used.

The selectively exposed second ultra-thin photoresist layer 180 is developed by contact with a suitable developer that removes either the exposed or unexposed portions of the second ultra-thin photoresist layer 180. The identity of the developer depends upon the specific chemical constitution of the second ultra-thin photoresist layer 180. For example, an aqueous alkaline solution may be employed to remove unexposed portions of the second ultra-thin photoresist layer 180. Alternatively, one or more of dilute aqueous acid solutions, hydroxide solutions, water, and organic solvent solutions may be employed to remove selected portions of the second ultra-thin photoresist layer 180. The developer is selected so that it does not degrade or etch the material of the second nitride layer 170, or at least degrades or etches the material of the second nitride layer 170 at a substantially slower rate as compared to the rate that the material of the second ultra-thin photoresist layer 180 is developed. In other words, the second nitride layer 170 serves as an etch-stop layer when developing the second ultra-thin photoresist layer 180.

The patterned second ultra-thin photoresist 210 may assume any suitable pattern, but typically the patterned second ultra-thin photoresist 210 corresponds to the desired control gate pattern. In the present invention, the patterned photoresist 210 defines one or more control gates. The patterned photoresist 210 defines one or more openings over the second nitride layer 170 corresponding to the isolation regions (having a distance "$d_2$") between the control gate(s) 44 (FIG. 2) to be formed. The patterned photoresist 210 serves as an etch mask layer for processing or etching the underlying second nitride layer 170.

Figure 25:
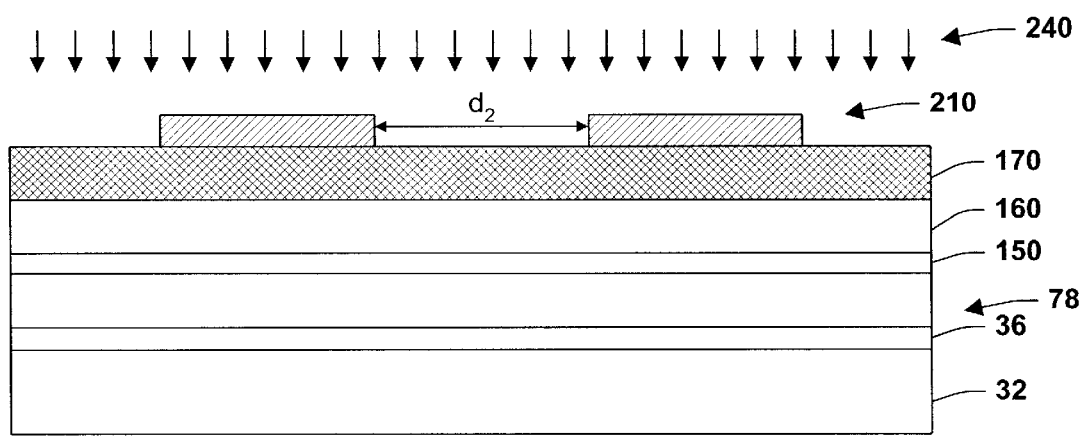
FIG. 25 is a schematic cross-sectional illustration of the nitride layer of FIG. 24 undergoing an etching step in accordance with one aspect of the present invention.
Figure 26:
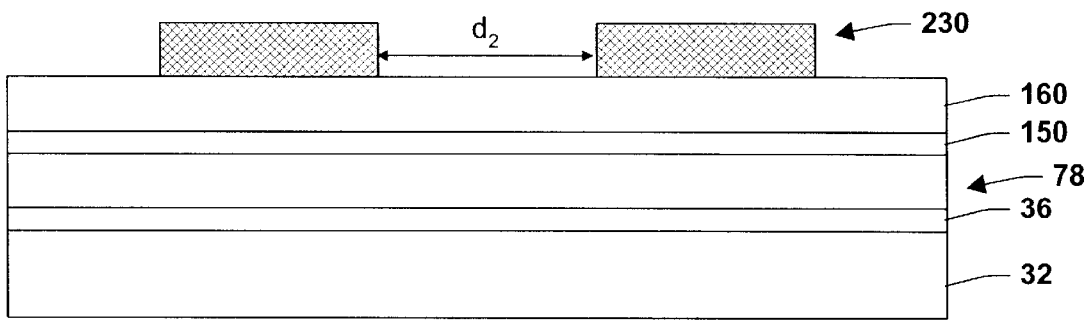
FIG. 26 is a schematic cross-sectional illustration of the nitride layer of FIG. 25 after the etching step is substantially complete in accordance with one aspect of the present invention.

Referring now to FIG. 25, the patterned photoresist 210 is used as a mask for selectively etching the second nitride layer 170 to provide patterned nitride layer 230 (FIG. 26) from a third etch step 240. Any suitable etch technique may be used to etch the second nitride layer 170. Preferably, a selective etch technique may be used to etch the material of the second nitride layer 170 at a relatively greater rate as compared to the rate that the material of the patterned photoresist 210 is etched. The third etch step 240 is also highly selective to the second nitride layer 170 over the underlying second gate material layer 160 so as to mitigate damage to the second gate material layer 160.

Preferably, the second nitride layer 170 is etched using an anisotropic etching process—dry or wet etching techniques may be employed, although dry etching is preferred. A nitride:photoresist etch technique may be used to etch the second nitride layer 170 to provide the patterned second nitride layer 230 and continue to define opening 212 exposing portions of the second gate material layer 160 lying under the patterned second nitride layer 230. The second nitride:photoresist etch selectivity may be within the range of 2:1 to greater than 40:1, and one skilled in the art could readily tailor a suitable etch chemistry to correspond to the characteristics of the second nitride layer 170 and the patterned photoresist 210. For example, using the patterned photoresist 210 as a mask, the second nitride layer 170 may be etched using magnetic enhanced reactive ion etching (MERIE) with $CH_3F$ chemistry that will not substantially attack the underlying second gate material layer. According to the present example, a MERIE method is used with reactant gases of $CH_3F$ (20–100 sccm) and $O_2$ (50–200 sccm) at a power level within the range of about 500–1000 W, and pressure within the range of about 20–200 mT. This chemistry has very high selectivity to the nitride material over the photoresist material and the selectivity of various embodiments, respectively, may be tailored to be greater than 5:1; greater than 10:1; greater than 20:1; greater than 30:1; and greater than 40:1 depending on the particular embodiment employed.

Figure 27:
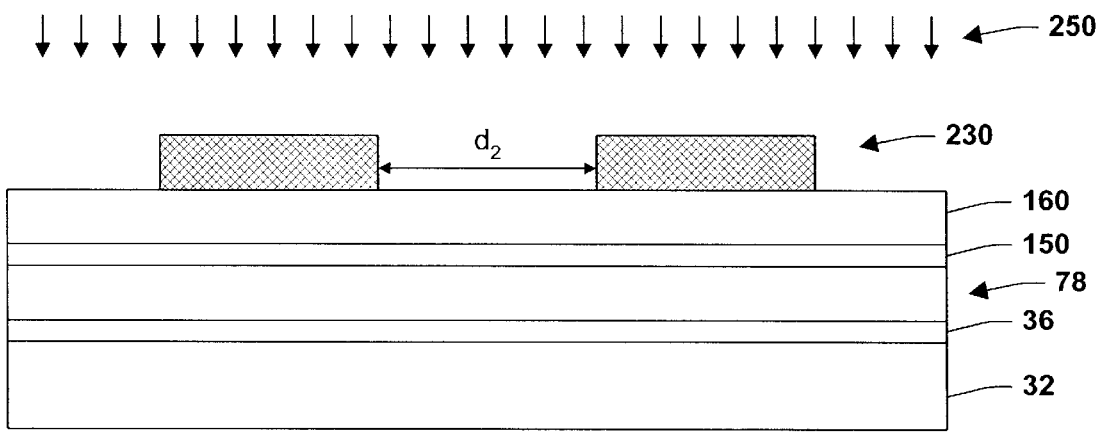
FIG. 27 is a schematic cross-sectional illustration of the second gate material layer of FIG. 26 undergoing an etching step in accordance with one aspect of the present invention.

Turning now to FIG. 27, the second gate material layer 160 is shown undergoing an etching process 250 wherein the patterned second nitride layer 230 serves a hard mask thereto. For example, the etching process 250 may include a reactive ion etch (RIE), that is highly selective to the second gate material layer 160 and the dielectric layer 150 with respect to the patterned second nitride layer 230. It is to be appreciated that any suitable etch methodology for selectively etching the second gate material layer 160 and dielectric layer 150 over the patterned second nitride layer 230 may be employed and is intended to fall within the scope of the hereto appended claims. For example, in the case of the second gate material 160 comprising polysilicon, the etch process 250 may include using a MERIE system with power within the range of about 300 W to 2000 W; pressure within the range of about 20 mT to 100 mT; and a gas chemistry including HBr at about 50 sccm to 200 sccm; He at about 0 sccm to 100 sccm; $O_2$ at about 0 sccm to 20 sccm; $Cl_2$ at about 0 sccm to 100 sccm and Ar at about 0 sccm to 100 sccm. The selectivity to the poly II layer 160 and the dielectric layer 150 over the hard mask 230 may range from 5:1 to greater than 40:1. Any remaining ultra-thin photoresist 210 (not shown) will be removed as well during the etch process 250 partly because of its thinness and inability to serve as a sole etch barrier for the poly II layer etch 250. However, if desired the second ultra-thin photoresist 210 may be completely stripped away prior to performing the etch process 250.

In the case of the second gate material 160 comprising a metal such as Cu, Al, Ta, TaN, Ti or TiN, the second gate material layer 160 may be etched with $Cl_2$ chemistry using magnetic enhanced reactive ion etching (MERIE), electron cyclotron etching (ECR), or conventional reactive ion etching (RIE) methods. According to the present example, a MERIE method is used with reactant gases of $Cl_2$ (30–200 sccm) and $BCL_3$ (10–200 sccm) at a power level within the range of about 300–800 W, and pressure within the range of about 60–400 mT. This chemistry has reasonably high selectivity to the metal material over the nitride material, and the selectivity of various embodiments, respectively, may be tailored to be greater than 5:1; greater than 6:1; greater than 7:1; greater than 8:1; greater than 9:1; and greater than 10:1 depending on the particular embodiment employed.

Figure 28:
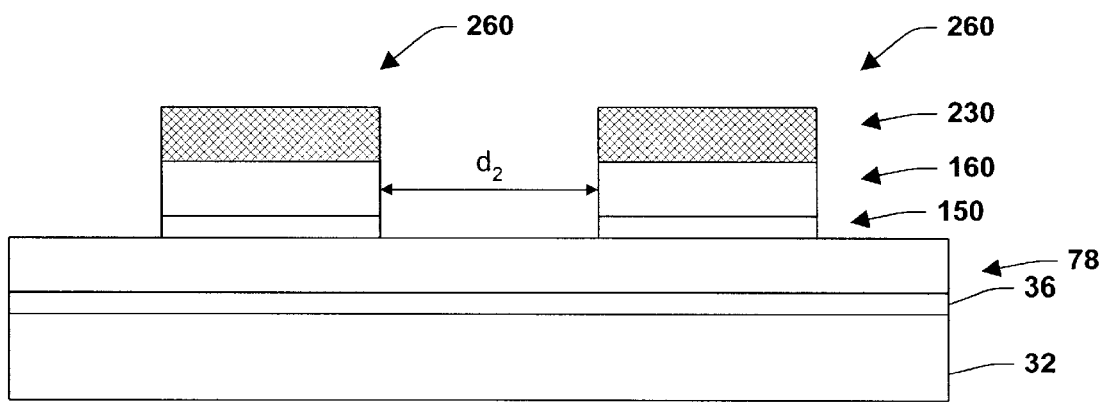
FIG. 28 is a schematic cross-sectional illustration of the second gate material layer of FIG. 27 after the etching step is substantially complete in accordance with one aspect of the present invention.

FIG. 28 illustrates the second gate material layer 160 after the etch process 250 is substantially complete to form stacked gate structures 260.

Figure 29:
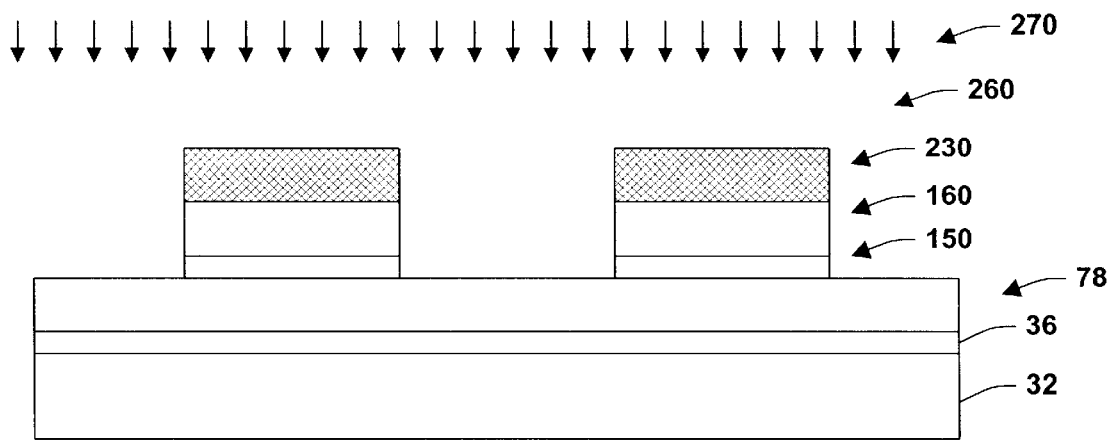
FIG. 29 is a schematic cross-sectional illustration of the nitride hard mask of FIG. 28 undergoing a stripping process in accordance with one aspect of the present invention.
Figure 30:
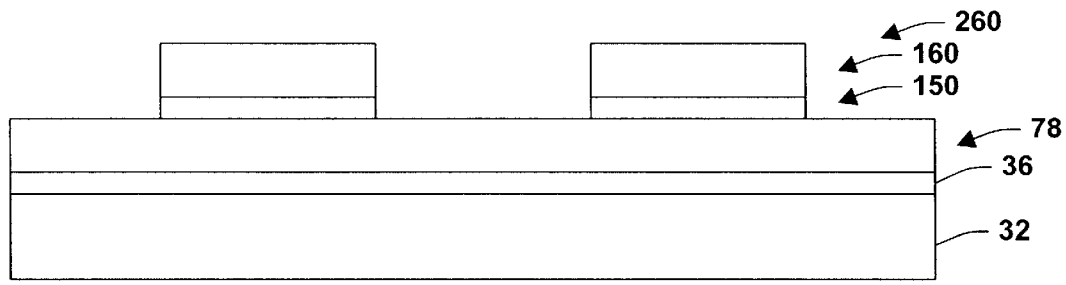
FIG. 30 is a schematic cross-sectional illustration of the memory structure substantially complete in accordance with one aspect of the present invention.

In FIG. 29, the hard mask 230 is shown undergoing a stripping process 270. Any suitable technique (e.g., using a hot phosphoric acid) may be employed to remove the hard mask 230. FIG. 30 illustrates in cross-section the substantially complete memory cell structure after the hard mask 230 has been removed.

Figure 31:
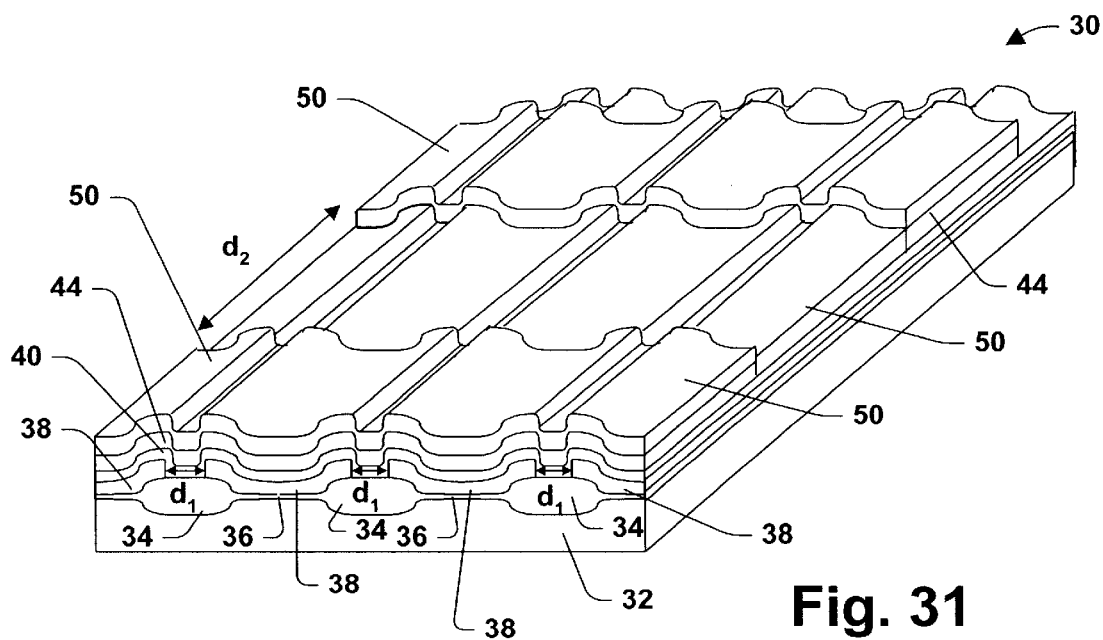
FIG. 31 is a perspective illustration of the memory structure in accordance with one aspect of the present invention.

FIG. 30 illustrates in cross-section the substantially complete memory device 30 and FIG. 31 illustrates in perspective view the memory device 30 after the capping layer 50 has been formed. The capping layer 50 preferably comprises nitride, however, any material suitable for protecting the memory device 30 may be employed. The formation of capping layers is well known, and therefore further discussion related thereto is omitted for sake of brevity.

The present invention provides for the formation of memory devices and gates thereof as well as other structures including gates having critical feature dimensions below 0.25 μm through the use of ultra-thin photoresists, short wavelength radiation, and nitride hard masks.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a gate, comprising:
   forming a nitride layer on a gate material layer, the nitride layer having a thickness within a range of 50 Å–1000 Å;
   forming an ultra-thin photoresist layer on the nitride layer;
   patterning the ultra-thin photoresist layer with short wavelength radiation to define a pattern for the gate, the short wavelength radiation being less than about 160 nm;
   using the ultra-thin photoresist layer as a mask during a first etch step to transfer the gate pattern to the nitride layer, the first etch step including an etch chemistry that is selective to the nitride layer over the ultra-thin photoresist layer; and
   using the nitride layer as a hard mask during a second etch step to form the gate by transferring the gate pattern to the gate material via the second etch step.

2. The method of claim 1 wherein the first etch step is highly selective to the nitride layer over the photoresist layer.

3. The method of claim 1, wherein the second etch step is highly selective to the gate material layer over the hard mask.

4. The method of claim 3, further including the step of using a gate material which comprises polysilicon.

5. The method of claim 3, further including the step of using a gate material which comprises a metal.

6. The method of claim 1, further including the step of forming the nitride layer to have a thickness within the range of about 50 Å–2000 Å.

7. The method of claim 1, further including the step of forming the nitride layer to have a thickness within the range of about 50 Å–1500 Å.

8. The method of claim 1, further including the step of forming the ultra-thin photoresist layer to have a thickness within the range of about 500 Å to 5000 Å.

9. The method of claim 1, further including the step of forming the ultra-thin photoresist layer to have a thickness within the range of about 1000 Å to 4000 Å.

10. The method of claim 1, further including the step of forming the ultra-thin photoresist layer to have a thickness within the range of about 500 Å to 2000 Å.

11. The method of claim 1, further including the step of using radiation having a wavelength less than about 100 nm.

12. The method of claim 1, further including the step of using radiation having a wavelength of about 13 nm.

13. The method of claim 1, further including the step of using radiation having a wavelength of about 11 nm.

14. The method of claim 1, further including the step of using X-rays as the radiation.

15. The method of claim 1, further including the step of using extreme ultra-violet radiation as the short wavelength radiation.

16. The method of claim 1, further including the step of using deep ultra-violet radiation as the short wavelength radiation.

17. The method of claim 1, further including an etch chemistry for the first etch having a selectivity to the nitride layer over the ultra-thin photoresist layer greater than about 40:1.

18. The method of claim 1, further including an etch chemistry for the first etch having a selectivity to the nitride layer over the ultra-thin photoresist layer greater than about 30:1.

19. The method of claim 1, further including an etch chemistry for the first etch having a selectivity to the nitride layer over the ultra-thin photoresist layer greater than about 20:1.

20. The method of claim 1, further including an etch chemistry for the first etch having a selectivity to the nitride layer over the ultra-thin photoresist layer greater than about 10:1.

21. The method of claim 1, further including an etch chemistry for the first etch having a selectivity to the nitride layer over the ultra-thin photoresist layer greater than about 5:1.

22. The method of claim 1, further including an etch chemistry for the second etch having a selectivity to the gate material layer over the nitride layer greater than about 5:1.

23. The method of claim 1, further including an etch chemistry for the second etch having a selectivity to the gate material layer over the nitride layer greater than about 6:1.

24. The method of claim 1, wherein the first etch step includes using a MERIE method with reactant gases of $CL_2$ (30–200 sccm) and $BCL_3$ (10–200 sccm) at a power level within the range of about 300–800 W, and pressure within the range of about 60–400 mT.

25. A method of forming a gate, comprising:
   forming a nitride layer on a gate material layer, the nitride layer having a thickness within a range of 50 Å–500 Å;
   forming an ultra-thin photoresist layer on the nitride layer, the ultra-thin photoresist layer having a thickness within a range of 50 Å–1000 Å;
   patterning the ultra-thin photoresist layer with short wavelength radiation to define a pattern for the gate, the short wavelength radiation falling within a range about 11 nm to 13 nm;
   using the ultra-thin photoresist layer as a mask during a first etch step to transfer the gate pattern to the nitride layer, the first etch step including an etch chemistry that is selective to the nitride layer over the ultra-thin photoresist layer; and
   using the nitride layer as a hard mask during a second etch step to form the gate by transferring the gate pattern to the gate material via the second etch step.

26. A method for fabricating a memory cell structure, comprising:
   forming a first nitride layer on a first gate material layer, the first nitride layer having a thickness within a range of 50 Å–1000 Å;
   forming a first ultra-thin photoresist layer on the first nitride layer, the first ultra-thin photoresist layer having a thickness within a range of 50 Å–1000 Å;
   patterning the first ultra-thin photoresist layer with short wavelength radiation to define a pattern for floating gates, the short wavelength radiation being less than 100 nm;
   using the first ultra-thin photoresist layer as a mask during a first etch step to transfer the floating gate pattern to the first nitride layer, the first etch step including an etch chemistry that is selective to the first nitride layer over the first ultra-thin photoresist layer; and
   using the first nitride layer as a hard mask during a second etch step to form the floating gates by transferring the floating gate pattern to the first gate material via the second etch step;
   forming an interpoly dielectric layer over the floating gates;
   forming a second gate material over the interpoly dielectric layer;

forming a second nitride layer on the second gate material layer, the second nitride layer having a thickness within a range of 50 Å–1000 Å;

forming a second ultra-thin photoresist layer on the second nitride layer;

patterning the second ultra-thin photoresist layer with short wavelength radiation to define a pattern for control gates, the short wavelength radiation being less than 100 nm;

using the second ultra-thin photoresist layer as a mask during a third etch step including an etch chemistry that is selective to the second nitride layer over the second ultra-thin photoresist layer; and using the second nitride layer as a hard mask during a fourth etch step to form the control gates by transferring the control gate pattern to the second gate material layer via the fourth etch step.

27. The method of claim 26, further including the step of having at least one of the first gate material layer and the second gate material layer comprise polysilicon.

28. The method of claim 26, further including the step of having at least one of the first gate material layer and the second gate material layer comprising at least one of: Cu, Al, Ta, TaN, Ti and TiN.

* * * * *

UNITED STATES PATENT AND TRADEMARK OFFICE
CERTIFICATE OF CORRECTION

PATENT NO.   : 6,309,926 B1
DATED        : October 30, 2001
INVENTOR(S)  : Scott A. Bell et al.

It is certified that error appears in the above-identified patent and that said Letters Patent is hereby corrected as shown below:

<u>Column 3,</u>
Line 32, please replace "Thc" with -- The --.

<u>Column 9,</u>
Line 54, please replace "I" with -- 1 --.

Signed and Sealed this

Fourth Day of June, 2002

Attest:

Attesting Officer

JAMES E. ROGAN
*Director of the United States Patent and Trademark Office*